United States Patent [19]

Hart

[11] 4,380,708
[45] Apr. 19, 1983

[54] I²L WITH POLYSILICON DIODES AND INTERCONNECTS

[75] Inventor: Cornelis M. Hart, Sunnyvale, Calif.

[73] Assignee: U.S. Philips Corporation, New York, N.Y.

[21] Appl. No.: 286,233

[22] Filed: Jul. 23, 1981

Related U.S. Application Data

[63] Continuation of Ser. No. 50,004, Jun. 18, 1979, abandoned.

[30] Foreign Application Priority Data

Jun. 29, 1978 [NL] Netherlands .......................... 7806989

[51] Int. Cl.³ ...................... H01L 29/04; H01L 27/04; H03K 19/091; H03K 19/092
[52] U.S. Cl. ..................................... 307/457; 307/459; 357/20; 357/59; 357/65; 357/68; 357/92
[58] Field of Search .................... 357/92, 59; 307/459, 307/477, 457

[56] References Cited

U.S. PATENT DOCUMENTS

| | | | |
|---|---|---|---|
| 4,041,522 | 8/1977 | Oguey et al. ........................ | 357/59 |
| 4,148,055 | 4/1979 | Edlinger et al. ...................... | 357/92 |
| 4,160,989 | 7/1979 | de Brebisson et al. ............... | 357/92 |
| 4,227,203 | 10/1980 | Mikoshiba ........................... | 357/20 |

FOREIGN PATENT DOCUMENTS 2749607  5/1978  Fed. Rep. of Germany ........ 357/59

OTHER PUBLICATIONS

Hewlett, Jr., IEEE J. of Solid State Circuits, vol. SC-10, No. 5, Oct. 1975, pp. 343-348.
Jaeger et al., IBM Technical Disclosure Bulletin, vol. 19, No. 10, Mar. 1977, pp. 3942-3946.
Mikoshiba, IEEE J. of Solid State Circuits, vol. SC 13, No. 4, Aug. 1978, pp. 483-489.

*Primary Examiner*—William D. Larkins
*Attorney, Agent, or Firm*—Thomas A. Briody; Robert T. Mayer; Steven R. Biren

[57] ABSTRACT

An integrated circuit includes a number of diode-coupled gate circuits, each having an inverter transistor. The logic signals are coupled between the gate circuits by conductive tracks which also form the coupling diodes. These diodes are mono-poly or poly diodes, and are formed integrally with the conductive tracks to achieve a flexible yet simple construction.

2 Claims, 4 Drawing Figures

I²L WITH POLYSILICON DIODES AND INTERCONNECTS

This is a continuation of application Ser. No. 050,004, filed June 18, 1979, now abandoned.

BACKGROUND OF THE INVENTION

The invention relates to an integrated circuit comprising gate circuits each having a signal input which is formed by a base of a bipolar transistor and at least two signal outputs which are each coupled via a diode to the collector of the bipolar transistor, the signal input comprising means to supply current, the integrated circuit comprising a semiconductor body having a major surface adjoined by the bipolar transistors of the said gate circuits, said transistors each having an emitter zone, a base zone and a collector zone formed by three semiconductor zones of alternate conductivity types located successively in a direction transverse to the major surface, at least the base zone and the collector zone adjoining the major surface, a system of signal connections for connecting the collector zone of a first of the transistors via a first diode junction to the base zone of a second of the transistors and via a second diode junction to the base zone of a third of the transistors, the signal connections comprising paths of conductive material separated from the major surface by an insulating layer and locally extending down to the major surface of the semiconductor body through apertures in the insulating layer.

Integrated logic circuits having gate circuits of this kind are known in various configurations. Reference may be made inter alia to the article "Schottky I²L" in "IEEE Journal of Solid State Circuits," Vol. SC-10, No. 5, pp. 343-348. The diode junctions in the signal connections between the collectors and the bases are constructed in this embodiment as Schottky junctions, which are provided directly on the collector region in question.

Signal connections having diodes integrated directly on the collector region of a transistor are also sometimes used in types of logic circuits other than I²L.

SUMMARY OF THE INVENTION

It is the object of the present invention to further improve prior art integrated circuits of the kind described above and notably to provide a greater flexibility with regard to topological construction, which greater flexibility results in a simplification of the design of the topological arrangement and/or an increase in the packing density so that a smaller semiconductor body will be sufficient for the same circuit.

According to the invention, an integrated circuit as described above is characterized in that the first and the second diode junction are p-n junctions each directly adjoining polycrystalline semiconductor tracks at least on one of their two sides throughout their surface, said semiconductor tracks belonging to the said paths of conductive material.

It is to be noted that poly-mono diodes and polydiodes are known per se and are used in integrated circuits. Hence the present invention does not relate to these diodes as such but to the use of these known diodes in the signal connections of integrated circuits of the kind described in the opening paragraph. Particularly in these signal connections said diodes can be provided simply and substantially without extra process steps and in particular a simplification of the manufacturing process and greater freedom with regard to doping concentrations is obtained as compared with the Schottky diodes commonly used in these connections. Moreover, greater flexibility with regard to topology is obtained because in the integrated circuit embodying the invention the diodes may be provided at will so as to adjoin the collector zone, so as to adjoin the base zone, or in a polycrystalline part of the signal path between the two transistors. In particular if the diode junctions are constructed as p-n junctions extending transversely to the major surface in the polycrystalline semiconductor signal paths, no extra space is necessary for the diodes at the surface of the semiconductor body.

In large integrated circuits, the so-called LSI circuits (LSI being the abbreviation of Large Scale Integration), long signal connections regularly occur between a first transistor, situated, for example, at or near an edge of a major surface of the semiconductor body, and two or more transistors of other gate circuits to be driven situated at a comparatively large distance and, for example, at or near an oppositely located edge of the major surface. In the usual construction with diodes integrated on the collector region a long signal path is necessary for each of the transistors to be driven, said path extending from the collector region of the first transistor to the relevant transistor to be driven. In an integrated circuit in accordance with the invention the pattern of signal paths is simplified because now one long signal path will suffice which extends from the collector region at one edge of the other edge and which near the transistors to be driven, for example, is divided into a number of branches in which a p-n junction is present in each of the branches and directly adjoining or not directly adjoining the base to be driven.

In addition to connections in which one controlling transistor drives two or more transistors situated at a comparatively large distance, connections also occur in which two or more controlling transistors are connected to the same transistor to be controlled and situated at a comparatively large distance from the controlling transistors. In this case the p-n junctions will usually be situated close to the controlling transistors so as to keep the pattern of conductor tracks as simple as possible. The location of the p-n junctions in the signal connections may thus be chosen freely. Depending on the logic network and the topological arrangement of the transistors of the gate circuits, comparatively long signal tracks may occur both between collector and p-n junction and between p-n junction and base.

BRIEF DESCRIPTION OF THE DRAWING

The invention will now be described in greater detail, by way of example, with reference to an embodiment and the accompanying drawing, in which.

DETAILED DESCRIPTION

Figure 1:
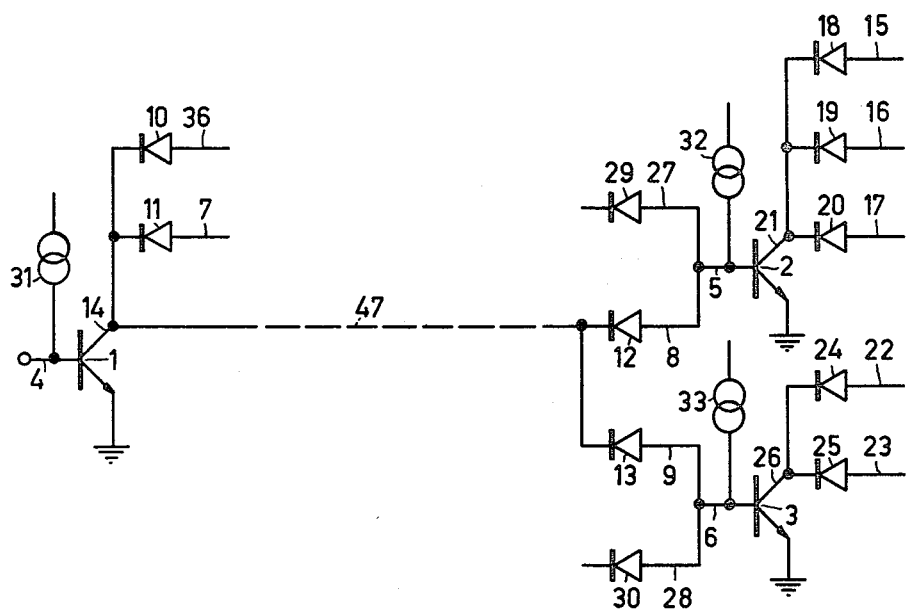
FIGS. 1 and 2 are circuit diagrams of parts of a logic network.
Figure 2:
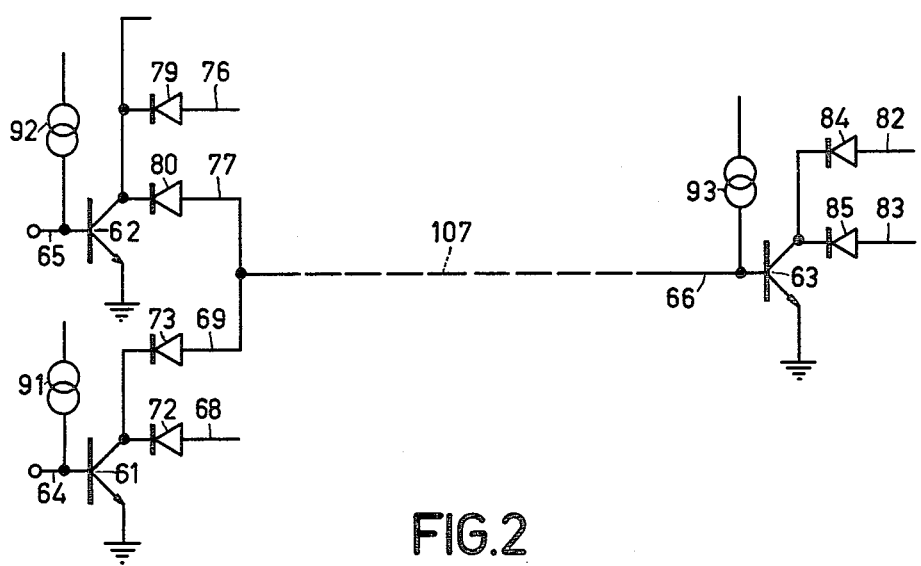
Figure 3:
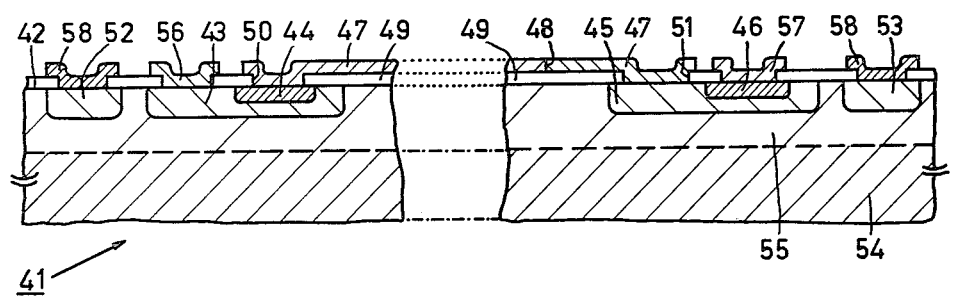
FIG. 3 is a diagrammatic cross-sectional view of a part of the semiconductor body of an example of an integrated circuit in accordance with the invention.

The embodiment to be described with reference to FIGS. 1, 2 and 3 is an integrated circuit having logic gate circuits each comprising a signal input which is formed by a base of a bipolar transistor. FIG. 1 shows three of such bipolar transistors 1, 2 and 3. The base of the transistor 1 constitutes the signal input 4 and the bases of the transistors 2 and 3 constitute the signal inputs 5 and 6, respectively.

Each of these gate circuits has at least two signal outputs which are each coupled, via a diode, to the collector of the bipolar transistor. The signal outputs 36, 7, 8 and 9 are each coupled to the collector 14 of transistor 1 via the diodes 10, 11, 12 and 13, respectively. The signal outputs 15, 16 and 17 are coupled to the collector 21 of transistor 2 via the diodes 18, 19 and 20, respectively. The signal outputs 22 and 23 are coupled to the collector 26 of transistor 3 via the diodes 24 and 25, respectively. The signal outputs 27 and 28 are connected to collectors of transistors not shown via diodes 29 and 30, respectively.

The signal inputs 4,5 and 6, respectively, of each of the gate circuits have means to supply current, which means are denoted by the current source 31, 32 and 33, respectively.

The integrated circuit shown in FIG. 3 comprises a semiconductor body 41 having a major surface 42 bounded by the bipolar transistors of the gate circuits. FIG. 3 shows the transistors 1 and 2, in which the transistor 1 has an emitter zone 54-55, a base zone 43, and a collector zone 44 and the transistor 2 has an emitter zone 54-55, a base zone 45 and a collector zone 46. The zones 54-55, 43 and 44, as well as the zones 54-55, 45 and 46, constitute three semiconductor zones of alternate conductivity types succeeding each other in a direction transverse to the major surface 42. The base zones 43 and 45 and the collector zones 44 and 46 adjoin the major surface 42.

The semiconductor body 41 consists, for example, of silicon and the zones 54-55, 44 and 46 are, for example, n-type, the zones 43 and 45 being p-type.

A system of signal connections 47 connects the collector 14 of transistor 1 via a first diode 12 and the signal output 8 to the signal input 4 and the base of transistor 2 and also via a second diode 13 and the signal output 9 to the signal input 6 and the base of transistor 3. FIG. 3 shows that a signal connection 47 connects the collector zone 44 of the transistor 54-55, 43, 44 to the base zone 45 of the transistor 54-55, 45, 46, via a diode junction 48. The signal connections 47 comprise paths of conductive material which are separated from the major surface 42 by an insulating layer 49 and which extend down to the major surface 42 locally through apertures 50, 51 in the insulating layer 49. The diode junction 48 constitutes the rectifying junction of the diode 12 of FIG. 1.

In the present example the current sources 31, 32 and 33 are realized in the form of lateral complementary transistors. Current can be supplied to the base zone 43 of the npn-transistor 54-55, 43, 44, via the current source 31 which comprises the lateral pnp-transistor 52, 55, 43. The current source 32 comprises the lateral pnp-transistor 53, 55, 45 which serves for current supply to the base zone 45 of the npn-transistor 54-55, 45, 46.

According to the invention, the first diode junction 48 of the diode 12 and the second diode junction of the diode 13 are p-n junctions each of which directly adjoins a polycrystalline semiconductor track on at least one of their two sides throughout their surface, and said semiconductor tracks form at least part of the said path 47 of conductive material. In the present example the signal connections 47 consist entirely of polycrystalline silicon which is n-type doped from the n-type collector zone 44 and the aperture 50 up to the p-n junction 48 and which is p-type doped from the junction 48 up to the aperture 51 and the p-type base zone 45.

FIG. 2 shows another combination of transistors which are connected together by signal connections and which may occur together with the combination of FIG. 1 in the same integrated circuit. This FIG. 2 shows a fourth, fifth and sixth transistor 61, 62 and 63, respectively, with signal inputs 64, 65 and 66, current sources 91, 92 and 93, diodes 72, 73, 79, 80, 84 and 85, and signal outputs 68, 69, 76, 77, 82 and 83.

The collector of the fourth transistor 61 is connected to the signal input 66 of the sixth transistor 63 via the diode 73 and the signal outputs 69. Furthermore, the collector of the fifth transistor 62 is connected to the signal input 66 of the sixth transistor 63 via the diode 80 and the signal output 77. Both the said connections are denoted by 107.

For completeness' sake it is to be noted that in addition to the two described combinations of interconnected transistors, many other combinations may occur in an integrated circuit in accordance with the invention.

In the example, the semiconductor body comprises a comparatively low-ohmic n-type region 54 which may be a substrate or a buried layer extending at and near the interface between a p-type substrate and a comparatively high-ohmic n-type surface layer 55. The surface layer 55 may be, for example, an epitaxial lever. The example relates to an I²L circuit in which the transistors of the gate circuit shown have a common emitter zone. The collector zones 44 and 46 are surface zones obtained by local doping and situated entirely within the associated base zones 43 and 45, respectively. The vertical bipolar transistors are hence transistors which, compared with the normal vertical planar transistor, operate in the reverse direction with an underlying emitter zone and an overlying collector zone. Although the present invention is not restricted to this type of I²L circuit, it relates here to a preferred embodiment which presents advantages.

The circuit diagram of FIGS. 1 and 2 with the use of the conventional Schottky junctions integrated on the collector zone cannot be realized in this type of I²L circuit having double diffused planar transistors with overlying collector zone. The doping concentration of the diffused collector zone is usually too high to make reliable Schottky junctions thereon. However, when polydiodes according to the invention are used, the diagram shown in FIGS. 1 and 2 can be realized in a particularly simple manner. If p-type semiconductor tracks are provided for the polycrystalline conductor paths 47, for example, after the base zones have been obtained, and an n-type doping is then provided locally, the collector zones and the diode junctions are obtained simultaneously with the same operational steps.

So far, double diffused planar transistors with overlying collector zones have mainly been used in the original form of I²L circuits in which multi-collector transistors are used. This original form is described, for example, in U.S. Pat. No. 4,286,177. In this original form the number of collectors of the planar inverter transistor and hence the number of outputs of the gate circuit is limited. One reason for this limit is when the number of collectors increases, the base-series resistance can adversely affect operation. Moreover, the gain factor β of the inverter transistor operated in the reverse direction in this form of I²L depends inter alia on the number of collectors present.

An integrated circuit in accordance with the present invention has the advantage that all inverter transistors may be equal to each other. In fact, they each need have only one collector. As a result of this the inverter transistors, at least on the average, are smaller and show less spreading in their electrical behavior. The gain factor β and the base resistance are independent of the number of outputs and the charge storage capacities of the transistors are more equal to each other.

In the present example, the part of the semiconductor track 47 adjoining the collector zone 44 of the first transistor up to the p-n junction 48 has a higher doping concentration than the part extending from the junction 48 up to the base zone 45 of the second transistor and a higher doping concentration than the base zones of the transistors. In general it is advantageous from the point of view of manufacture if the parts of the polycrystalline signal paths adjoining the collector zones are more highly doped than the base zones of the transistors. The first-mentioned parts may then be doped during the treatments which are necessary to provide the most highly doped zones of the transistors.

The polycrystalline signal connections with diode junctions are preferably used in combination with first, second and third and/or fourth, fifth and sixth transistors of the type with an overlying collector zone, in which the collector zone 44, 46, viewed in a direction transverse to the major surface 42 of the semiconductor body 41, is situated entirely above the associated base zone 43 and 45, respectively. In this combination, the electrical advantages, known from the use of signal connections with Schottky-diodes, have been realized to a considerable extent without having to use a complicated manufacturing method to obtain an overlying collector zone with a sufficiently low doping concentration to be able to integrate Schottky diodes thereon. The doping concentrations for the collector and/or base zones can be chosen more freely when using the invention. The overlying collector zones advantageously have a higher doping concentration than the base zones adjoining said collector zones as is usual in the case of planar double-diffused or double-implanted transistors.

In addition to the advantage of area saving which is obtained when mono-poly diodes or polydiodes are used as compared with similar gate circuits constructed with Schottky diodes, another important advantage relates to the topologic flexibility. In accordance with the present invention, the diode junctions may arbitrarily be constructed as a mono-poly diode directly adjoining the collector zone or directly adjoining the base zone. Preferably, however, poly-diodes are used as described with reference to FIG. 3, in which the diode junction 48 is present entirely in the polycrystalline material and preferably extends transversely to the major surface.

Thus, the location of the diode junctions in the signal connections can be chosen substantially freely. Generally this leads to a pattern of conductor tracks which can be designed more simply and/or more easily. Particularly in the case of large integrated circuits the overall length of the conductor tracks may be comparatively smaller and hence also the area required for the conductor pattern due to a suitable location of the diode junctions may be smaller. In the case of long signal connections, for example, conductor tracks extending from one side of the major surface along and/or over intermediately located gate circuits to an oppositely located side of the major surface, the distance between the collector zone 44 of the first transistor and the first diode junction 48 measured along the signal connection 47 is preferably larger and advantageously at least three times larger than the second distance between the diode junction 48 and the base zone 45 of the second transistor measured along the signal connection 47. By arranging in these long signal connections that the diode junctions are comparatively close together and comparatively close to at least one of the base zones of the transistors to be driven it is possible for the signal connection from the collector zone to consist for a considerable part of its length of a single conductor track, which track is divided only in the proximity of one or more of the transistors to be driven into branches each leading to such a transistor.

In the case of the long signal connections of the kind shown in FIG. 2, the diodes 73 and 80 are preferably placed close to the respective transistors 61 and 62, so that in this case also the long signal connection 107 may consist of a single conductor track for the greater part of its length. The longest part of the signal connection is situated between the diodes 73 and 80 at one end and the base of the sixth transistor 63 at the other and is preferably at least three times longer than the smaller of the two parts situated between the collectors of the fourth and fifth transistors, respectively, and the associated diodes 73 and 80, respectively. If this longer part comprises a polycrystalline semiconductor track, the polycrystalline semiconductor material is preferably p-type doped.

The two kinds of signal connections may occur partly between the same transistors. The first transistor then, for example, may be the same as the fourth transistor or the second transistor may be the same as the sixth transistor.

When using the invention, the location of the diode junctions in the topology of the integrated circuit is no longer restricted directly to the location of the transistor due to the selected mode of manufacture. As a result of this, long signal connections of the kind shown in FIG. 1 can be realized in the same integrated circuit together with those of the kind shown in FIG. 2 so that the required pattern of conductor tracks becomes comparatively simple.

Figure 4:
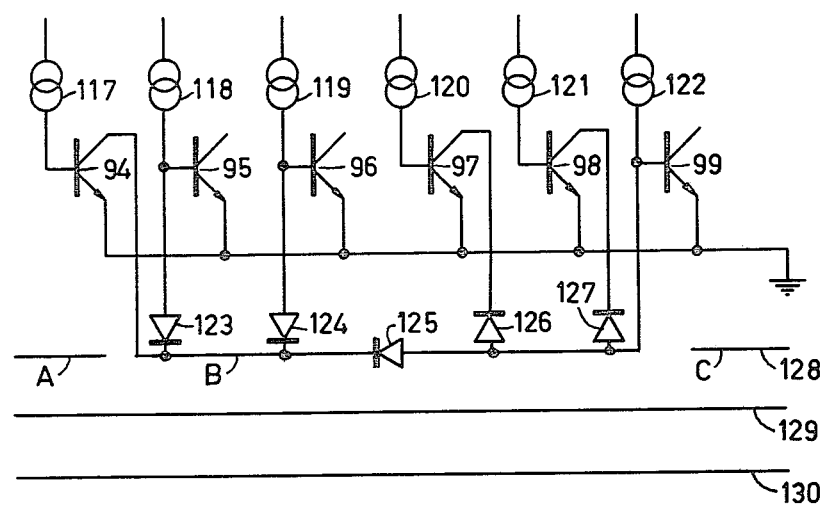
FIG. 4 shows diagrammatically the topology or layout of a part of an example of the integrated circuit in accordance with the invention.

FIG. 4 shows diagrammatically the topology of a part of an integrated circuit with a row of juxtaposed transistors 94 to 99 each having a current source 117 to 122, respectively. A number of conductor tracks 128, 129 and 130 for the electric connection of the transistors in the direction of the row extend beside the row of conductors. Each of these tracks, for example, the track 128, may consist of several individual parts A, B and C. Generally, these conductor tracks 128 to 130 will be situated between two rows of transistors. The number of these juxtaposed conductor tracks which is necessary for the signal connections depends inter alia on the location which is chosen for the p-n junctions in combination with an adapted sequence of the transistors in their row. With this number of conductor tracks, the mutual distance of the two transistor rows also depends on the location of the diodes.

The gate circuits (of which the transistors 94 to 99 form a part) are completed by diodes which are incorporated substantially in the interconnection path containing the tracks 128, 129 and 130. FIG. 4 shows the diodes 123 to 127. The collector of transistor 94 is connected, via diode 123, to the base of transistor 95, via diode 124 to the base of transistor 96 and via diode 125 to the base of transistor 99. This latter base is connected in addition, via the diode 126, to the collector of transistor 97 and via diode 127 to the collector of transistor 97. If a comparatively long part of a conductor track is directly connected to a collector (transistor 94), then this long part is connected, via a p-n junction, to at least one comparatively short track which leads directly to the base of a further transistor (95 and 96, respectively). If a comparatively long part of a conductor track is directly connected to a base (transistor 99), then this long part is connected, via a p-n junction, to at least one comparatively short track which is connected directly to a collector of a further transistor (97 and 98, respectively).

The base zone 43 and the collector zone 46 (FIG. 3) are provided with conductive connections 56 and 57, respectively. These connections may consist of polycrystalline semiconductor material or of another suitable conductive layer, for example, aluminum or titanium-platinum-gold. Collector and/or base connections of nonsemiconductor material may occur notably at the signal inputs and signal outputs of the integrated circuits. The conductive contacts 58 of the emitters 52 and 53 of the lateral pnp-transistor also consist of conductive material, for example, aluminum or doped polycrystalline semiconductor material.

Furthermore, a second layer (not shown) of conductive tracks for electric connections may be present, which second layer is separated from the polycrystalline connection 47 by a second insulating layer (not shown). In this case, signal connections 47 may also consist partly, for example, of an aluminum track situated in the second layer and partly of a polycrystalline semiconductor track situated in the first layer, said various part being interconnected through apertures in the second insulating layer.

In order to reduce the series resistance, longer polycrystalline tracks may be provided, if desired, over a greater or smaller part of their length with a thin layer of silicide in an otherwise known manner or be covered with a metal layer. Short-circuiting of the diode junctions is prevented by covering the junctions previously with a masking layer and/or locally removing the provided resistance-reducing layer.

The present invention is not restricted to I²L circuits and may also be used, for example, in logic circuits as published in "Electronics", June 8, 1978, pp. 41 and 42. This type of logic circuit also has for each circuit one single planar inverter transistor with several schottky diodes integrated on the collector region of the transistor. In this case the Schottky diodes can advantageously be replaced by poly-diodes or mono-poly diodeds. The inverter transistors used in this type of circuit in the usual direction, with an overlying emitter, may be constructed to be smaller, substantially no space being necessary at the major surface for the diodes, while in addition, as explained with reference to FIGS. 1, 2 and 3, the pattern of signal connections is simplified and becomes more flexible. Moreover, in the case of inverter transistors with overlying emitter, the poly diodes can be obtained simultaneously with the provision of the emitter zones in known manner so that the manufacturing process can become simpler.

For completeness' sake it is to be noted that, as is known, it is necessary for proper operation of the logic gate circuits described that the sum of the collector-emitter voltage of a conductive inverter transistor, the forward voltage occurring across a conductive diode and the voltage drop caused by the series resistance of the signal connection should be smaller than the emitter-base voltage associated with the conductive state of the inverter transistor. Just as the Schottky diodes in the known constructions, mono-poly and poly diodes, as compared with planar p-n junctions in monocrystalline semiconductor material, have a comparatively high $I_o$ which enables the fulfilment of the above condition. However, in connection with this condition, it may be necessary not to operate the gate circuits of an integrated circuit according to the invention with currents above a given maximum value. This maximum current level will be higher as the series resistance is smaller, the surface of the p-n junction of the diodes larger and also, as has been found experimentally, as the grain size of the polycrystalline semiconductor material is smaller. Therefore, the polycrystalline semiconductor layer from which the semiconductor tracks are obtained in an otherwise known manner, is grown at not too high a temperature, for example at approximately 800° C., and preferably in a stage of the manufacture in which operations requiring as high temperature have already been carried out as much as possible. By exposing the polycrystalline semiconductor layer to a minimum possible number of operations at high temperature, recrystallization in the semiconductor layer, as a result of which the grain size increases, is restricted as much as possible.

Instead of silicon, other semiconductor materials, for example germanium or $A_{III}B_V$ compounds, may also be used. Other materials, for example, silicon nitride or combinations of oxide layers and nitride layers, may be used for the insulating layers in addition to silicon oxide. In the embodiment described the conductivity types may be changed. Instead of current sources 31, 32 and 33 being constructed as lateral transistor, the current supply to the signal inputs of the gate circuits may also be carried out by means of resistors. Such resistors can be integrated in the usual manner on and/or in the semiconductor body.

What is claimed is:

1. An integrated circuit having a plurality of gate circuits, which comprises:
    a semiconductor body having a major surface;
    at least first, second and third bipolar transistors, each having an emitter zone, a base zone forming a signal input and a collector zone located successively in a direction transverse to said major surface, at least the base and collector zones of said transistors adjoining said major surface;
    means for supplying surrent connected to each signal input;
    a plurality of diodes connected to each collector zone to form a plurality of signal outputs from each transistor;
    an insulating layer on at least a portion of said major surface;
    a system of signal connections for connecting at least the collector zone of said first transistor to the base zones of said second and third transistors, said system of signal connections comprising a plurality of paths of conductive material on said insulating layer and locally extending down to said major surface through apertures in said insulating layer to contact at least the collector zone of said first transistor and the base zones of said second and third transistors, said paths of conductive material comprising a polycrystalline semiconductor track and at least first and second diode junctions for coupling the collector zone of said first transistor respectively to the base zones of said second and third transistors, said first and second diode junctions comprising p-n junctions each adjoining and formed from said polycrystalline semiconductor track on at least one side of each junction, each junction being spaced apart from the collector zone of said first transistor and the base zones of said second and third transistors, the distance between the collector zone of the first transistor and the first diode junction measured along the signal connection being larger than the distance between the first diode junction and the base zone of the second transistor measured along the signal connection, and the first and second diode junctions being situated closer to the second and third transistors, respectively, than to the first transistor; and fourth, fifth and sixth bipolar transistors and third and fourth p-n junctions, the collector zones of said fourth and fifth transistor being connected to the base of said sixth transistor by, respectively, said third and fourth p-n junctions, said third p-n junction being closer to said fourth transistor than said sixth, and said fourth p-n junction being closer to said fifth transistor than said sixth.

2. An integrated circuit as claimed in claim 1, wherein the first-mentioned distance is at least three times larger than the second-mentioned, smaller distance.

* * * * *

UNITED STATES PATENT AND TRADEMARK OFFICE
CERTIFICATE OF CORRECTION

PATENT NO. : 4,380,708

DATED : April 19, 1983

INVENTOR(S) : CORNELIS M. HART

It is certified that error appears in the above—identified patent and that said Letters Patent is hereby corrected as shown below:

Column 8, line 53, claim 1, change "surrent" to -- current --.

Signed and Sealed this

Twenty-eighth Day of June 1983

[SEAL]

Attest:

Attesting Officer

GERALD J. MOSSINGHOFF

Commissioner of Patents and Trademarks